(12) United States Patent
Nakao (10) Patent No.: US 10,802,095 B2
(45) Date of Patent: Oct. 13, 2020

(54) APPARATUS AND METHOD FOR PROCESSING SPECTRUM

(71) Applicant: JEOL Ltd., Tokyo (JP)

(72) Inventor: Tomoki Nakao, Tokyo (JP)

(73) Assignee: Jeol Ltd., Tokyo (JP)

( * ) Notice: Subject to any disclaimer, the term of this patent is extended or adjusted under 35 U.S.C. 154(b) by 0 days.

(21) Appl. No.: 16/285,864

(22) Filed: Feb. 26, 2019

(65) Prior Publication Data

US 2019/0265318 A1    Aug. 29, 2019

(30) Foreign Application Priority Data

Feb. 28, 2018 (JP) .................................. 2018-034052

(51) Int. Cl.
*G01R 33/46* (2006.01)
*G01R 33/54* (2006.01)
(52) U.S. Cl.
CPC ......... *G01R 33/46* (2013.01); *G01R 33/4625* (2013.01); *G01R 33/54* (2013.01)
(58) Field of Classification Search
USPC ....................................................... 324/307
See application file for complete search history.

(56) References Cited

U.S. PATENT DOCUMENTS

| 8,400,148 B2* | 3/2013 | Hirata | G01R 33/485 |
| | | | 324/307 |
| 2012/0065948 A1* | 3/2012 | Tan | G01N 21/359 |
| | | | 703/2 |
| 2019/0154778 A1* | 5/2019 | Nakao | G01R 33/4625 |
| 2019/0219651 A1* | 7/2019 | Nakao | G06F 17/17 |

OTHER PUBLICATIONS

More, "The Levenberg-Marquardt Algorithm: Implementation and Theory", Conference on Numerical Analysis, University of Dundee, Scotland, Jun. 28-Jul. 1, 1977, pp. 1-12.
Laatikainen et al., "A Computational Strategy for the Deconvolution of NMR Spectra with Multiplet Structures and Constraints: Analysis of Overlapping 13C-2H multiplets of 13C Enriched Metabolites from Cell Suspensions Incubated in Deuterated Media", Kuopio NMR Research Group, Apr. 12, 1996, pp. 359-365, Brussels, Belgium.
Soininen et al., "Strategies for organic impurity quantification by 1H NMR spectroscopy: Constrained total-line-shape fitting", Analytica Chimica ACTA, Apr. 22, 2005, pp. 178-185, vol. 542.
Sigl, "Nonlinear Residual Minimization by Iteratively Reweighted Least Squares", Technische Universitat Munchen, Apr. 28, 2015, pp. 1-37.
Daubechies et al., "Iteratively Reweighted Least Squares Minimization for Sparse Recovery", Communications on Pure and Applied Mathematics, 2010, pp. 1-38, vol. LXIII.

* cited by examiner

*Primary Examiner* — Rodney E Fuller
(74) *Attorney, Agent, or Firm* — The Webb Law Firm (57) ABSTRACT

A spectrum y includes a waveform-of-interest component and a baseline component which is a wide-band component. A weight array x is applied with respect to a base function array A to generate a baseline model Ax. An optimum baseline model Ax' is searched according to a first condition to fit a corresponding portion $S_I Ax$ of the base line model Ax with respect to a representative portion $y_I$ of the baseline component and a second condition to reduce an Lp norm (wherein $p \leq 1$) of the weight array x.

9 Claims, 9 Drawing Sheets

Input $y$ and $I$.                                       ...(S10)

Compose $S_I$, $A$                                       ...(S12)

$B = S_I A$                                              ...(S14)

$y_I = S_I y$                                            ...(S16)

$L_f = \max(\text{eig}(B^H B))$                          ...(S18)

Initialization $x_0 = B^+ y_I$ and $k = 0$.                             ...(S20)

while $k <= k_{\max}$ do                                 ...(S22)

$\quad x_{k+1} = x_k + \frac{1}{L_f} B^H (y_I - B x_k)$  ...(S24)

$\quad x_{k+1} = \text{soft}\left(x_{k+1}, \frac{\lambda}{L_f}\right)$  ...(S26)

$\quad k = k + 1$                                        ...(S28)

end while

FIG. 4

| | |
|---|---|
| Input $y$ and $I$, $p(\leq 1)$. | ⋯(S10a) |
| $\epsilon(>0)$, $\lambda(>0)$ | ⋯(S30) |
| Compose $S_I$, $A$ | ⋯(S12) |
| $B = S_I A$ | ⋯(S14) |
| $y_I = S_I y$ | ⋯(S16) |
| Initialization | |
| $x_0 = B^+ y_I$ and $k = 0$. | ⋯(S20) |
| while $k <= k_{max}$ do | ⋯(S22) |
|    $w_i = [|x_k(i)| + \epsilon]^{(p-2)/2}$ | ⋯(S32) |
|    $W = \text{diag}([w_1, \ldots, w_N])$ | ⋯(S34) |
|    $x_{k+1} = (B^H B + \lambda W^T W)^+ B^H y_I$ | ⋯(S36) |
|    $k = k + 1$ | ⋯(S28) |
| end while | |

| | |
|---|---|
| Input $y$ and $I$, $p(\leq 1)$. | ···(S10a) |
| $\epsilon(>0)$ | ···(S30a) |
| Compose $S_I$, $A$ | ···(S12) |
| $B = S_I A$ | ···(S14) |
| $y_I = S_I y$ | ···(S16) |
| Initialization | |
| $x_0 = B^+ y_I$ and $k = 0$. | ···(S20) |
| while $k <= k_{max}$ do | ···(S22) |
| $\quad w_i = [|x_k(i)| + \epsilon]^{(p-2)/2}$ | ···(S32) |
| $\quad W = \text{diag}(w_1, \ldots, w_N)$ | ···(S34) |
| $\quad x_{k+1} = W^{-1} B^H (B W^{-1} W^{-1} B^H)^+ y_I$ | ···(S38) |
| $\quad k = k + 1$ | ···(S28) |
| end while | |

FIG. 9

APPARATUS AND METHOD FOR PROCESSING SPECTRUM

CROSS REFERENCE TO RELATED APPLICATION

This application claims priority to Japanese Patent Application No. 2018-034052 filed Feb. 28, 2018, the disclosure of which is hereby incorporated by reference in its entirety.

BACKGROUND OF THE INVENTION

Field of the Invention

The present disclosure relates to an apparatus and a method for processing a spectrum, and in particular to estimation of a baseline component.

Description of Related Art

As a spectrum to be a target of spectrum analysis, there are known an NMR (Nuclear Magnetic Resonance) spectrum, an X-ray spectrum, a spectroscopic spectrum, a mass spectrum, and the like. In general, a spectrum includes a waveform-of-interest component and a baseline component. The waveform-of-interest component is a portion including one or a plurality of peaks, and is the primary analysis target. On the other hand, the baseline component is a component which is not the primary analysis target, and is a component which exists over a wide range in a frequency space (frequency region).

For example, in observation of an NMR spectrum, a linking noise which is generated during a measurement step, a data loss after a digital filter process, a signal component derived from a molecular structure, or the like causes the baseline component. A change, a curvature, a slope, or the like having a large period, corresponding to a bottom side in the NMR spectrum, is the baseline component, or such a bottom side itself is the baseline component.

Juliane Sigl. Nonlinear Residual Minimization by Iteratively Reweighted Least Squares, Comput. Optim. Appl. 64, 755 (2015) discloses a nonlinear residual minimization method using an IRLS (Iterative Reweighted Least Squares) method.

In order to improve analysis precision of the waveform-of-interest component in the spectrum, prior to the spectrum analysis or at the same time as the spectrum analysis, the baseline component in the spectrum is estimated and is removed from the spectrum. For the estimation of the baseline component, the baseline component is fitted by a model. As functions defining the model, there are known an Nth order polynomial function, a cosine function, a sine function, a spline function, a piecewise linear function, and the like.

However, operations to appropriately select a function defining the model and to assign appropriate parameters for the function usually impose a large burden on the user, and a certain level of experience is required for appropriately performing these tasks. When these operations are not appropriately performed, the estimation precision of the baseline component is reduced, and consequently, the spectrum analysis precision is reduced. Alternatively, the baseline component may be estimated for necessities other than those described above.

An advantage of the present disclosure lies in precise estimation of the baseline component contained in a spectrum. Alternatively, an advantage of the present disclosure lies in estimation of a baseline component and removal of the baseline component from the spectrum without imposing a large burden on the user.

SUMMARY OF THE INVENTION

According to one aspect of the present disclosure, there is provided an apparatus for processing a spectrum, comprising: a processor that receives and processes a spectrum which includes a baseline component, wherein the processor has a function to generate a baseline model by applying a weight array comprising a plurality of weights with respect to a base function array comprising a plurality of base functions, and the processor searches, in executing the function, an optimum baseline model as an estimated baseline component according to a first condition to fit the baseline model with respect to the baseline component and a second condition to reduce an Lp norm (wherein p≤1) of the weight array.

In the above-described structure, the baseline model is generated by applying the weight array to the base function array. For example, when the weight function is searched based on only the first condition, the weights are more easily uniformly and widely assigned for the plurality of base functions of the base function array, and, as a result, excessive fitting tends to be more easily caused. To the contrary, according to the above-described structure, the weight array is searched to satisfy the second condition, in addition to the first condition. That is, the weight array is searched to satisfy the condition to reduce the Lp norm of the weight array. Because the value of p is less than or equal to 1, with the progress of the search of the weight array, a sparsity of the weight function is increased. That is, a ratio of the weight of zero or a weight close to zero in the weight array is increased. As a result, a baseline model tends to be more easily constructed or defined by a small number of base functions representing basic properties of the baseline component serving as a wide-band component, and occurrence of the problem of excessive fitting can be prevented or reduced.

In the related art, when a number of prepared base functions is increased, there has been a problem in that convergence of the solution is slowed down. However, according to the above-described structure, even when a large number of base functions are prepared, the number of base functions to which significant weights are assigned is only a small number, and convergence of the solution can be expected to be quickened in comparison to the related art. In other words, according to the above-described method, because a larger number of base functions can be prepared, a superior fitting result can be obtained even for a special baseline component. In addition, in the related art, the appropriateness of the function selection and order designation by the user significantly affect the fitting result, but according to the above-described structure, a superior fitting result can be obtained without imposing a significant burden on the user. The above-described structure is a method which expands the function fitting method of the related art, and, in this regard, there is an advantage that the mechanism of the fitting can be easily and intuitively understood by the user.

Each base function corresponds to an element forming the baseline model. A parameter which defines a degree of contribution of each base function is the weight. Alternatively, an optimum solution of the baseline model may be searched by using an evaluation value reflecting the first condition and the second condition, and minimizing the evaluation value. Alternatively, assuming that the first condition is satisfied to a certain degree, the optimum solution of the baseline model may be searched according to the second condition; that is, the Lp norm minimization condition. Here, the "optimum solution" does not need to be the optimum solution in the strict sense, and it is sufficient that the optimum solution is an optimum solution presumed in the computation. For example, a solution at the time when a completion condition is satisfied may be the optimum solution. The above-described processor functions as a means that receives the spectrum, a means that generates a baseline model, and a means that searches the optimum baseline model.

According to another aspect of the present disclosure, the weight array becomes sparse in the process of searching the optimum baseline model, and the optimum baseline model is formed by a part of the base function array. The weight array becoming sparse means an increase in a number of the weights of zero (or the weights near zero) included in the weight array. That is, a number of base functions which is substantially nullified is increased; that is, a number of base functions which act with a significance is reduced. The optimum baseline model is defined by a part of the base functions after such a narrowing process.

With regard to the Lp norm, the action to increase the sparsity of the norm computation target only appears when p is less than or equal to 1, and, in general, the degree of the action becomes larger as the value of p becomes smaller. Therefore, the value of p may be changed according to the contents of the baseline component or the like. The value of p is defined to be greater than or equal to 0 and less than or equal to 1.0. When p is 0 (when L0 norm is used), the solution may become unstable depending on the circumstances, and thus, p is desirably set to be greater than 0.

According to another aspect of the present disclosure, the processor subtracts the estimated baseline component from the spectrum. As a result of the subtraction, the baseline component is removed, and it becomes possible to extract the waveform-of-interest component.

According to another aspect of the present disclosure, the first condition is a condition to fit a corresponding portion in the baseline model with respect to a representative portion in the baseline component. The baseline component serving as a wide-band component generally extends over the entirety of the spectrum, but for the fitting, it is desirable to avoid a portion where components other than the baseline component is prominent or dominant. The representative portion may be designated as a plurality of points representing the baseline component, or as one or more sections. The representative portion may be designated by the user or may be automatically determined.

According to another aspect of the present disclosure, an evaluation value J is defined by an L2 norm of a residual determined from the baseline component and the baseline model and an Lp norm of the baseline model, and a condition to minimize the evaluation value J forms the first condition and the second condition. According to another aspect of the present disclosure, a representative portion in the baseline component is selected from the spectrum, and the residual is a residual between the representative portion in the baseline component and a corresponding portion in the baseline model.

According to another aspect of the present disclosure, there is provided a method of processing a spectrum, comprising: receiving a spectrum which includes a baseline component; and generating a baseline model by applying a weight array comprising a plurality of weights with respect to a base function array comprising a plurality of base functions, wherein the generation of the baseline model includes searching an optimum baseline model as an estimated baseline component according to a first condition to fit the baseline model with respect to the baseline component and a second condition to reduce an Lp norm (wherein $p \leq 1$) of the weight array.

The above-described method may be realized as a function of hardware or a function of software. In the latter case, a program for executing the method of processing the spectrum is installed to an information processor apparatus via a network or a transportable recording medium. A concept of the information processor apparatus includes an NMR measurement apparatus.

BRIEF DESCRIPTION OF THE DRAWINGS

Embodiment(s) of the present disclosure will be described by reference to the following figures, wherein.

DESCRIPTION OF THE INVENTION

An embodiment of the present disclosure will now be described with reference to the drawings.

Figure 1:
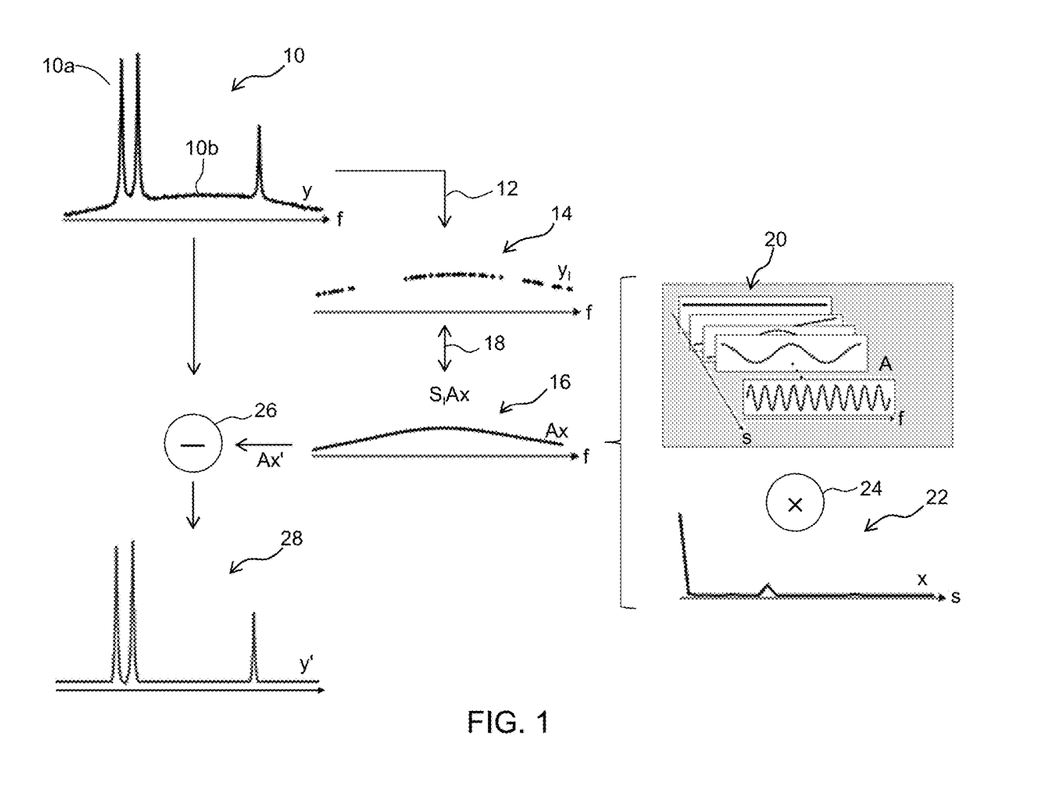
FIG. 1 is a conceptual diagram showing a flow of a spectrum processing according to an embodiment of the present disclosure.

FIG. 1 schematically shows a flow of a processing of a spectrum according to the embodiment. An NMR spectrum 10 (hereinafter, simply referred to as a "spectrum" 10) shown at upper left is a target of processing. A horizontal axis shows a frequency f, and a vertical axis shows a power or an intensity. In the later description, the spectrum 10 is expressed by y. The spectrum 10 includes a waveform-of-interest component 10a and a baseline component 10b. The baseline component 10b is a component other than the waveform-of-interest component 10a, is a component spreading over a wide band, and corresponds to a bottom side of the spectrum 10. In analysis of the spectrum, it is desired to remove the baseline component 10b in advance.

In a process indicated by reference numeral 12, a representative portion 14 is designated by a user or automatically from the spectrum 10. In the later description, the representative portion 14 is represented by $y_r$. In the configuration exemplified in the drawings, the representative portion 14 is designated as a plurality of points. The points are set while avoiding the waveform-of-interest component 10a. In other words, the points are set in a concentrated manner in portions that likely correspond to the baseline component. Alternatively, the representative portion 14 may be designated by designating one or more sections on the horizontal axis.

In a method according to the embodiment, a baseline model 16 simulating the baseline component 10b is generated. In the later description, the baseline model 16 is represented by Ax. A and x will be described later. In reality, a corresponding portion in the baseline model is fitted with respect to the representative portion 14 in the baseline component. In the later description, the corresponding portion; that is, the fitted portion, is represented by $S_I Ax$. $S_I$ will be described later.

In a process indicated by reference numeral 18, the baseline model 16 is generated such that a first condition and a second condition are both satisfied. As will be described later in detail, the first condition is a condition to reduce an L2 norm of a residual in which the corresponding portion is subtracted from the representative portion 14. The second condition is a condition to reduce an Lp norm of a weight array to be described below. Here, $0 \leq p \leq 1$, and, when stability of the solution is to be sought, $0 \leq p \leq 1$. When p is less than or equal to 1, it is known that sparsity of the solution is increased during the search of the solution using the Lp norm. In the embodiment, this property is utilized in the search of the weight array.

In the embodiment, a base function array 20 comprising a plurality of base functions is prepared, and a weight array 22 is multiplied therewith. The multiplication is shown by reference numeral 24. One weight is assigned to one base function. When a value of the weight is zero, the base function to which the weight is multiplied substantially does not function. Results of multiplications of the plurality of weights to the plurality of base functions are added, to generate the baseline model 16. Normally, various types of functions having various orders are prepared as the base function array 20. For example, a plurality of polynomials from a first-order polynomial to a tenth-order polynomial, a plurality of cosine functions from a first-order cosine function to a twentieth-order cosine function, and the like are prepared. Alternatively, other functions may be prepared. According to the embodiment, even when a large number of base functions are prepared, problem such as excessive fitting does not tend to occur. The individual function is identified by an index s (or a base function number s).

The weight array 22 is optimized so that both the first condition and the second condition are satisfied. In this process, the sparsity of the weight array 22 is gradually increased, in particular according to the second condition. The weight array 22 exemplified in FIG. 1 assigns a meaningful weight only to a part of the base functions, and assigns a weight of zero or near zero for a large number of remaining base functions. When a large number of base functions are prepared, while the degree of freedom of the fitting can be increased, the problem of excessive fitting tends to occur. With the utilization of the sparsity of the solution realized by the Lp norm, such a problem can be avoided or reduced.

The search is completed when a search result of the weight array satisfies a completion condition, and an optimum baseline model is constructed or defined based on the weight array at that point. In the later description, the optimum baseline model is represented by x'. A process indicated by reference numeral 26 shows subtraction of the optimum baseline model from the spectrum 10. With this process, a spectrum 28 from which the baseline component is removed is obtained. In the later description, the spectrum 28 is represented by y'.

Figure 2:
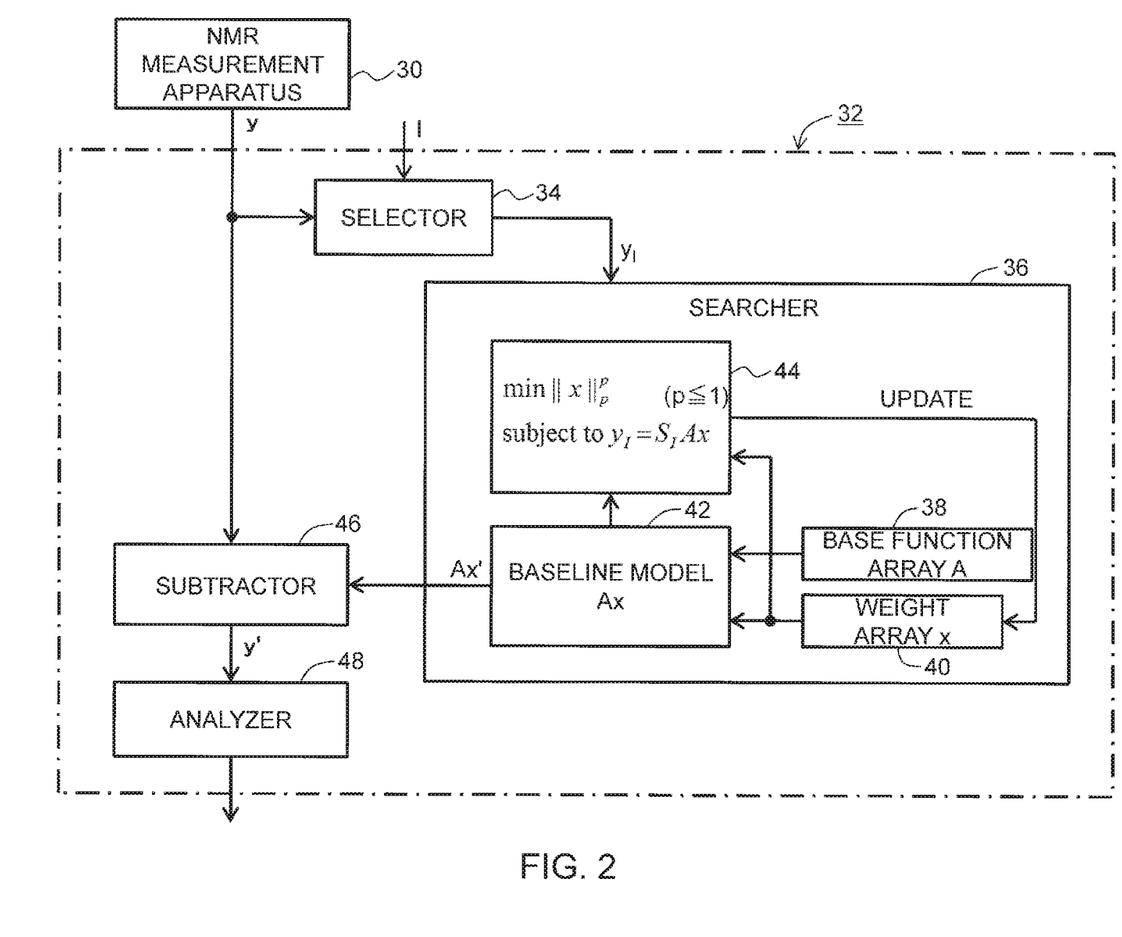
FIG. 2 is a block diagram showing functions of a spectrum processing apparatus according to an embodiment of the present disclosure.

FIG. 2 shows an NMR measurement system. The NMR measurement system is formed from an NMR measurement apparatus 30 and a spectrum processing apparatus 32. Spectrum data are transferred from the NMR measurement apparatus 30 to the spectrum processing apparatus 32. The transfer is done, for example, via a network or via a storage medium.

Although the details of the NMR measurement apparatus 30 are not shown in FIG. 2, the NMR measurement apparatus 30 is formed from a spectrometer and a measurement unit. The measurement unit is formed from a static magnetic field generator, a probe, and the like. The static magnetic field generator has a bore serving as a vertical through hole, and an insertion unit of the probe is inserted into the inside of the bore. In a head of the insertion unit, a detection circuit which detects an NMR signal from a sample is provided. The spectrometer is formed from a controller, a transmission unit, a reception unit, and the like. The transmission unit generates a transmission signal according to a transmission pulse sequence, and the transmission signal is sent to the probe. With this process, an electromagnetic wave is irradiated onto the sample. Then, the NMR signal from the sample is detected by the probe. A reception signal generated by the detection is sent to the reception unit. In the reception unit, an NMR spectrum is generated by an FFT computation on the reception signal. The NMR spectrum is sent to the spectrum processing apparatus 32 as necessary. Alternatively, the spectrum processing apparatus 32 may be incorporated into the NMR measurement apparatus 30.

In the embodiment, the spectrum processing apparatus 32 is formed from an information processor apparatus such as a computer. In FIG. 2, a plurality of representative functions of the spectrum processing apparatus 32 are represented by a plurality of blocks.

In FIG. 2, an observed spectrum y is input to the spectrum processing apparatus 32. The spectrum y is sent to a selector 34 which functions as a selection means. The selector 34 is a unit which selects a portion designated by the user in the spectrum as the representative portion $y_I$ in the baseline component. In general, the baseline component which is a wide-band component exists over the entirety of the spectrum y. Thus, the representative portion $y_I$ is selected such that components other than the baseline component (that is, the waveform-of-interest component) are not set as the target of fitting. Alternatively, depending on the contents of the spectrum y, the entirety of the spectrum y, and not the selected representative portion $y_I$, may be input to a searcher 36 to be described below.

The searcher 36 functions as a searching means, and searches an optimum solution of the weight array x according to a presumption condition (first condition) expressed by the following Equation (1-2) and a basic condition (second condition) expressed by the following Equation (1-1). The weight array x is a vector having a plurality of weights as elements.

[Equation 1]

$$\min \|x\|_p^p \tag{1-1}$$

$$\text{subject to } y_I = S_I A x \tag{1-2}$$

Equation (1-2) described above shows that the baseline component is fitted by the baseline model, and more specifically, shows that the representative portion $y_I$ in the baseline component is fitted by the corresponding portion $S_I Ax$ in the baseline model Ax. A is a matrix representing the base function array. Specifically, A is a matrix made of a plurality of base signal vectors representing a plurality of base functions. In A, each base signal vector is a column vector. Ax is a baseline model (baseline component in computation) obtained by applying the plurality of weights with respect to the plurality of base signal vectors. The representative portion $y_I$ is a vector made of spectrum elements corresponding to observation points I (I has a value of, for example, 1 to 256). $S_I$ is a sample vector corresponding to the observation point I. By applying the $S_I$ with respect to the baseline model Ax, the corresponding portion $S_I$Ax is extracted.

Equation (1-1) described above shows a condition to minimize the Lp norm (wherein p≤1) of the weight array x. When p is less than or equal to 1, the Lp norm functions to increase the sparsity of the solution which is the norm computation target, in the process of solving the problem of minimizing the Lp norm. A range of p is 0≤p≤1. However, when p is 0, the solution may become unstable, and thus, in order to avoid the instability, desirably, 0<p≤1. The spectrum processing apparatus 32 searches the weight array assuming that the weight array to be determined at the end has sparsity, and utilizing the property of the Lp norm to increase the sparsity of the solution. In general, p is 1, but when the weight array is expected to have a high sparsity, p may be set, for example, to 0.75 or 0.5. When a number of elements of the weight array is N, and a number of elements of the representative portion $y_I$ is M, the representative portion $y_I$ is a matrix of M rows and one column, and the sample matrix $S_I$ is a matrix of M rows and N columns. When the number of base function is K, the base function array A is a matrix of N rows and K columns, For the norm, in general, representations shown by Equation (2-1) and by Equation (2-2) shown below are permitted. In the present disclosure, the "Lp norm" basically refers to a norm defined by Equation (2-2). A value n is a number of elements of the vector.

[Equation 2]

$$\|x\|_p = (|x_1|^p + |x_2|^p + \ldots + |x_n|^p)^{1/p} \quad (2\text{-}1)$$

$$\|x\|_p^p = (|x_1|^p + |x_2|^p + \ldots + |x_n|^p) \quad (2\text{-}2)$$

In FIG. 2, reference numeral 38 schematically shows the base function array A, and reference numeral 40 schematically shows the weight array x. Reference numeral 42 shows a baseline model Ax generated from the base function array A and the weight array x. The baseline model Ax is repeatedly generated while the weight array x is updated. Reference numeral 44 shows a portion where the optimum solution of the weight array x is searched, to satisfy the first condition and the second condition. For the search of the optimum solution, an Iterative Soft Thresholding (IST) method, an Iterative Reweighted Least Squares (IRLS) method, a Spectroscopy by Integration of Frequency and Time domain (SIFT) method, or the like may be used. When p=1, the IST method is desirably used. When p is less than 1, the IRLS method is desirably used. A first configuration described below is based on the IST method. A second configuration and a third configuration described below are based on the IRLS method.

A subtractor 46 is a unit which subtracts the optimum baseline model Ax' from the spectrum y when the optimum solution x' of the weight array x is determined, and functions as a subtracting means. With this process, a spectrum y' in which the baseline component is removed or reduced is obtained. The spectrum y' becomes an analysis target at an analyzer 48.

Figure 3:
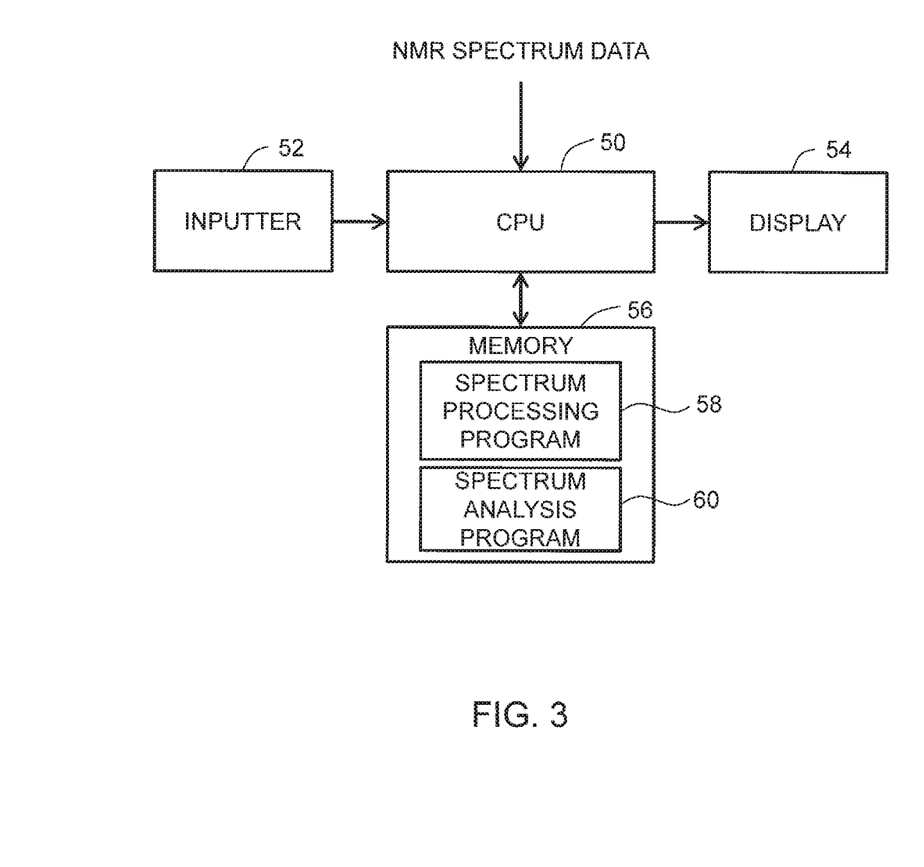
FIG. 3 is a block diagram showing an information processor apparatus which functions as a spectrum processing apparatus.

FIG. 3 shows an example configuration of an information processor apparatus which functions as the spectrum processing apparatus. The information processor apparatus comprises a CPU 50, a memory 56, an inputter 52, a display 54, and the like. In the memory 56, a spectrum processing program 58 and a spectrum analysis program 60 are stored. The spectrum processing program 58 is a program for executing the spectrum processing explained above with reference to FIGS. 1 and 2. The spectrum analysis program 60 is a program for analyzing the spectrum after preprocessing. The programs 58 and 60 are executed by the CPU 50.

The CPU 50 functions as the searching means, the selection means, the subtracting means, and the like. The inputter 52 is formed from a keyboard, a pointing device, or the like, and the representative portion is designated by the user using the inputter 52. The display 54 is formed from, for example, an LCD, and a spectrum before processing is displayed thereon. Alternatively, a range of the representative portion or a group of representative points may be designated on the spectrum by the user. Alternatively, the spectrum process may be executed by a plurality of processors, or the spectrum process may be executed by a plurality of information processor apparatuses.

Figure 4:
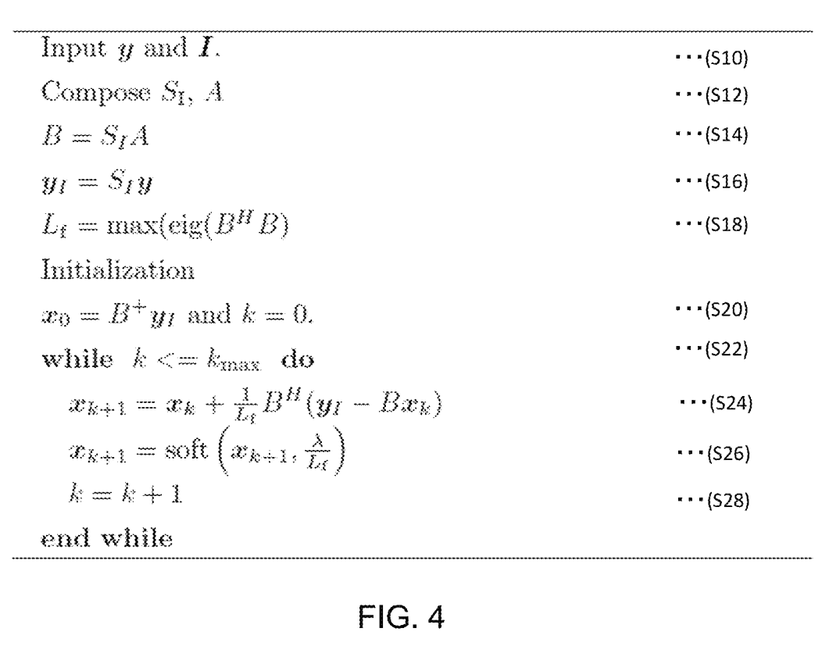
FIG. 4 is a diagram showing an algorithm according to a first configuration.

Next, a first configuration will be described. In the first configuration, p=1, and the weight array is searched as the optimum solution according to a condition to minimize an evaluation value J shown in the following Equation 3.

[Equation 3]

$$J = \frac{1}{2}\|y_I - S_I A x\|_2^2 + \frac{\lambda}{2}\|x\|_1^1 \quad (3)$$

A first term in Equation (3) corresponds to the first condition, and is a portion for computing an L2 norm of a residual ($y_I$-$S_I$Ax) between the representative portion $y_I$ of the baseline component and the corresponding portion $S_I$Ax of the baseline model. A second term in Equation (3) corresponds to the second condition, and is a portion for computing an L1 norm of the weight array x. A parameter λ is a regularization weight.

In general, in order to solve the problem of minimizing the evaluation value J, differentiation of the computation formula of the evaluation value J is required. However, while the first term is differentiable, the second term is difficult to differentiate. Thus, the above-described problem is solved according to the known IST (Iterative Soft Thresholding) method.

FIG. 4 shows an algorithm according to the first configuration. In S10, a spectrum y and a coordinate array (observation point) I specifying the group of representative points are read. In S12, the sample matrix $S_I$ and the base function array A are formed. A formula shown in S14 replaces the matrix $S_I$A included in Equations (1) and (3) into B for convenience of computation. In S16, the representative portion $y_I$ is formed based on the spectrum y and the coordinate array I. In S18, a Lipschitz coefficient $L_f$ is computed. The coefficient is a maximum value of a plurality of eigenvalues for $B^H B$; that is, the maximum eigenvalue (alternatively, the Lipschitz coefficient $L_f$ may be set to be greater than or equal to the maximum eigenvalue). $B^H$ is a Hermitian transpose of B. In S20, an initial weight array $x_0$ is generated from the representative portion $y_I$. $B^+$ is a pseudo-inverse matrix of the matrix B. In addition, in S20, k is initialized.

In S22, the first completion condition is judged. Specifically, it is judged whether or not k which shows the number of computations is less than or equal to a maximum value kmax. When k≤kmax, S24 and S26 are executed. A computation formula shown in S24 and a computation formula shown in S26 update the weight array x in two stages. The computation formula shown in S24 is determined by once differentiating the first term in Equation (3), and updates the weight array x to minimize the L2 norm of the first term. The computation formula shown in S26 corresponds to the second term in Equation (3). Because the differentiation of the second term is difficult, a soft threshold function soft( ) is used. The function re-constructs $x_{k+1}$ based on a computation result $x_{k+1}$ of S24 in the following manner.

[Equation 4]

If $\lambda/L_f < x_{k+1}$ Then $x_{k+1} = x - \lambda/L_f$      (4-1)

If $-\lambda/L_f \leq x_{k+1} \leq \lambda/L_f$ Then $x_{k+1} = 0$      (4-2)

If $x_{k+1} < -\lambda/L_f$ Then $x_{k+1} = x + \lambda/L_f$      (4-3)

With the use of the soft threshold function soft( ), the weight array x is updated to minimize the L1 norm. In S28, k is incremented. The weight array $x_{k+1}$ at the time when the above-described first completion condition is satisfied is output as the optimum weight array.

Alternatively, a second completion condition may be added to the above-described algorithm. For example, immediately after S26, an index e defined by the following Equation (5) may be computed, and the algorithm may be completed when the index e becomes less than or equal to a certain value.

[Equation 5]

$$e = \frac{\|x_{k+1} - x_k\|_2^2}{\|x_{k+1}\|_2^2}$$      (5)

A denominator of Equation (5) is an L2 norm of updated weight array $x_{k+1}$, and a numerator of Equation (5) is an L2 norm of a difference of weight arrays $x_k$ and $x_{k+1}$ before and after the update. Alternatively, other second completion conditions may be defined.

Figure 5:
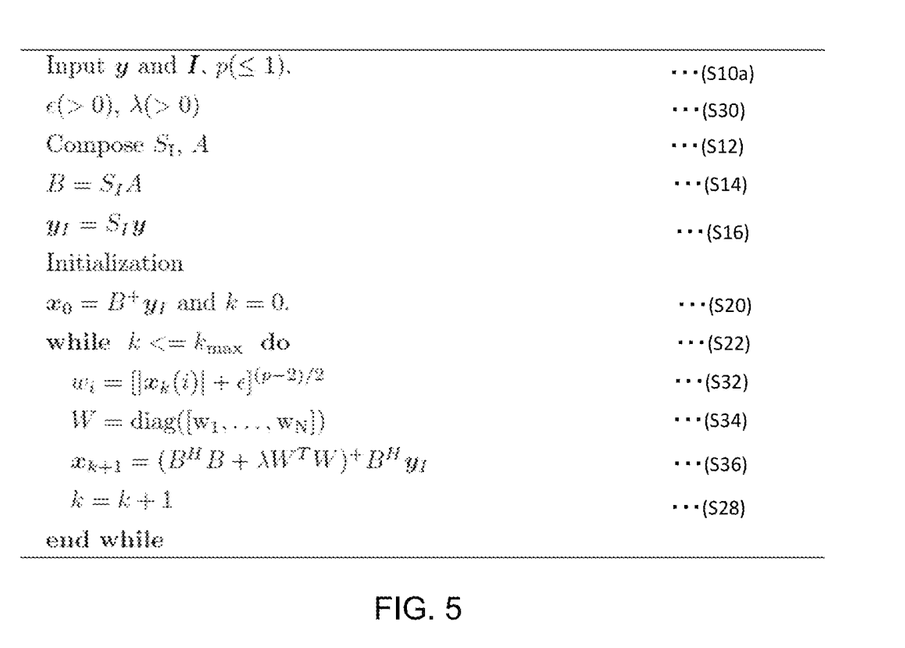
FIG. 5 is a diagram showing an algorithm according to a second configuration.

FIG. 5 shows an algorithm in the second configuration. The algorithm follows the IRLS method. The evaluation value J is defined based on the following Equation (6).

[Equation 6]

$$J = \frac{1}{2}\|y_I - S_I A x\|_2^2 + \frac{\lambda}{2}\|x\|_p^p$$      (6)

For example, p is 0.75. Alternatively, another numerical value which is less than or equal to 1 may be assigned as p. According to the IRLS method, the second term of Equation (6) which is difficult to differentiate is expressed as the following Equation (7) using a weight matrix W.

[Equation 7]

$$J = \frac{1}{2}\|y_I - S_I A x\|_2^2 + \frac{\lambda}{2}\|Wx\|_2^2$$      (7)

A second term in Equation (7) is a computation formula of the L2 norm, which can be once differentiated.

In FIG. 5, steps similar to those of FIG. 4 are assigned the same reference numerals, and will not be described again. In step 10a, the spectrum y and the coordinate array I are read, and the value of p is defined. For example, as described above, 0.75 is assigned to p. In S30, numerical values are assigned to a coefficient c for preventing division by zero, and the regularization weight λ. The subsequent steps of S12~S22 have already been described above.

In S32 which follows these steps, according to the IRLS method, a plurality of weight elements $w_i$ are defined. In S34, the weight matrix W is defined in which the plurality of weight elements are set as diagonal elements and zero is assigned to all elements other than the diagonal elements. A computation formula shown in S36 is an updating formula of the weight array x, and is determined by once differentiating Equation (7). By repeatedly executing the computation formula shown in S36, an optimum solution of the weight array x which satisfies the condition to minimize the evaluation value J is determined.

Figure 6:
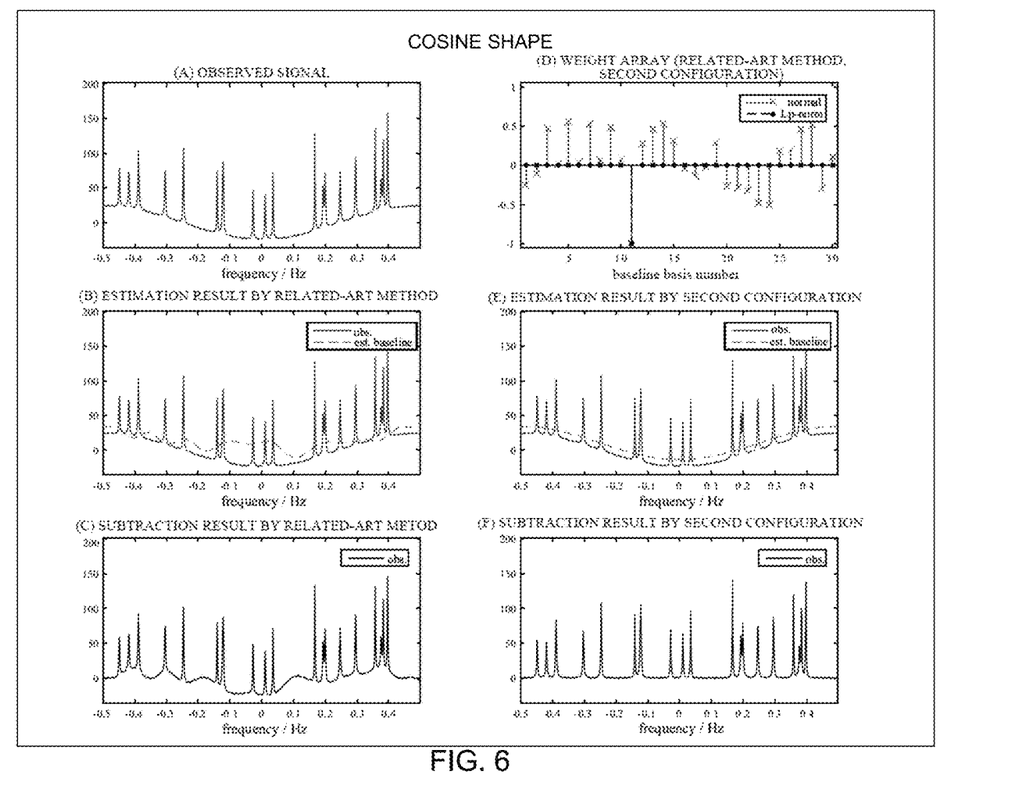
FIG. 6 is a diagram showing a result (part 1) of spectrum processing according to the second configuration.
Figure 7:
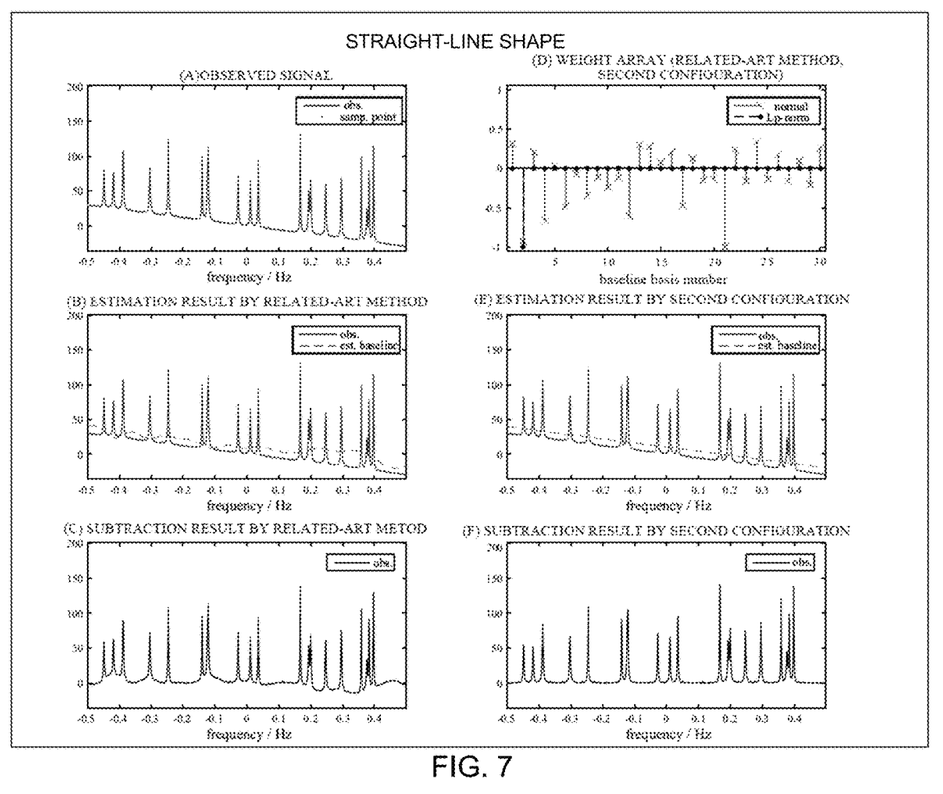
FIG. 7 is a diagram showing a result (part 2) of the spectrum processing according to the second configuration.
Figure 8:
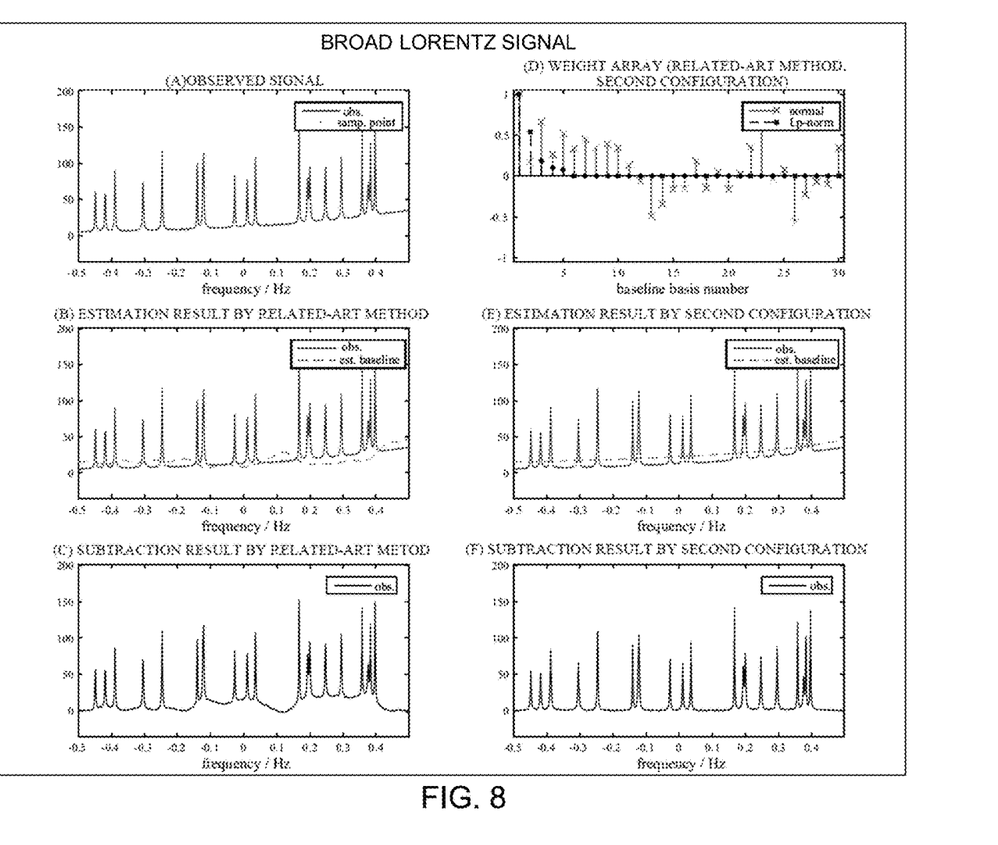
FIG. 8 is a diagram showing a result (part 3) of the spectrum processing according to the second configuration.

An advantage of the second configuration will now be described with reference to FIGS. 6 to 8. FIG. 6 shows an experimental result when the baseline component is simulated by a cosine shape. FIG. 7 shows an experimental result when the baseline component is simulated by a straight line shape. FIG. 8 shows an experimental result when the baseline signal is simulated by a broad Lorentz signal (component near 0.75 Hz).

In FIGS. 6 to 8, (A) shows a spectrum including a baseline component which is artificially added, and (B) shows a result of estimation of the baseline component according to the method of the related art (typical least squares fitting). A solid line shows the spectrum, and a broken line shows the estimated baseline component. (C) shows a result of subtraction of the baseline component according to the method of the related art, (D) shows a weight array (refer to a cross sign) in the method of the related art and the weight array (refer to a circle sign) in the second configuration, and (E) shows a result of estimation of the baseline component according to the second configuration. A solid line shows the spectrum, and a broken line shows the estimated baseline component. (F) shows a result of the subtraction of the baseline component according to the second configuration.

In both the method of the related art and the second configuration of the present disclosure, the same base function array is used. Specifically, the base function array is made of 10 Nth order polynomials including a first-order polynomial to a tenth-order polynomial, 10 Nth order cosine functions including a first-order cosine function to a tenth-order cosine function, and 10 Nth order sine functions including a first-order sine function to a tenth-order sine function. The observation points are manually set. In FIGS. 6 to 8, for the purpose of the observation, an offset is added in the display of the baseline component.

In FIGS. 6 to 8, in the method of the related art, as shown in (D), the weights are assigned approximately evenly for the entirety of the base function array, and, as a result, influences of excessive fitting are observed, as in (B). In particular, the excessive fitting is caused for sections for which the observation point is not set. On the other hand, according to the second configuration of the present disclosure, as shown in (D), the weight array is made sparse; that is, the baseline component is estimated with a small number of base functions. As a result, as shown in (E), the baseline component is estimated with a high precision. A superior result similar to that for the second configuration is basically obtained with the first configuration, and the third configuration to be described next.

Figure 9:
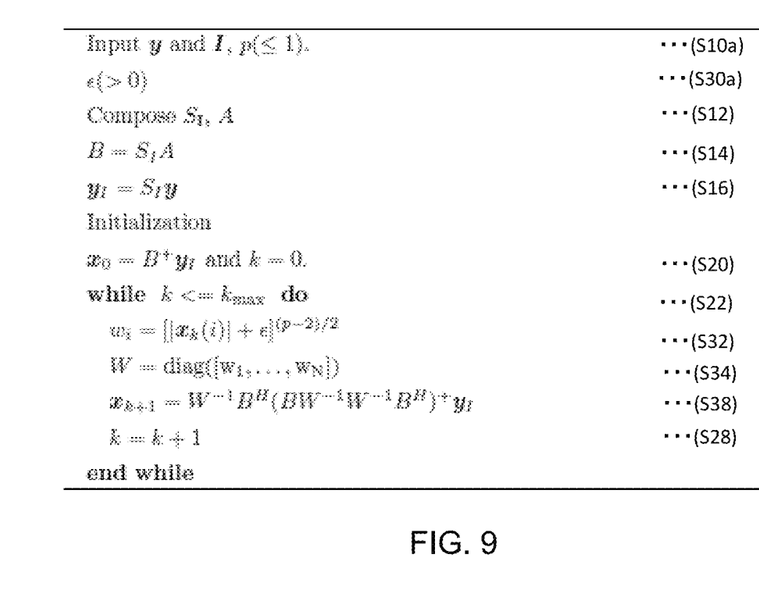
FIG. 9 is a diagram showing an algorithm according to a third configuration.

FIG. 9 shows an algorithm of the third configuration. The algorithm is based on an underdetermined IRLS method. The method can be utilized when the number of elements M of the sample set is smaller than a total number of data N. For example, p is 0.75. Alternatively, another numerical value less than or equal to 1 may be assigned to p.

Equations (1-1) and (1-2) are rewritten as the following Equations (8-1) and (8-2) using the weight matrix W and based on the IRLS method. Equation (8-2) is identical to Equation (1-2).

[Equation 8]

$$\min \|Wx\|_2^2 \qquad (8\text{-}1)$$

$$\text{subject to } y_I S_I A x \qquad (8\text{-}2)$$

When the matrix $S_I A$ described above is a wide-width matrix (that is, underdetermined), Equations (8-1) and (8-2) described above can be rewritten into the following equivalent Equations (9-1) and (9-2) based on the underdetermined IRLS method.

[Equation 9]

$$\min \|z\|_2^2 \qquad (9\text{-}1)$$

$$\text{subject to } y_I = S_I A W^{-1} z \qquad (9\text{-}2)$$
$$= B W^{-1} z$$

A solution satisfying Equations (9-1) and (9-2) is computed by the following Equation (10).

[Equation 10]

$$x = W^{-1} B^H (B W^{-1} W^{-1} B^H)^{-1} y_I \qquad (10)$$

The algorithm shown in FIG. 9 is based on the following idea. In FIG. 9, steps similar to the steps shown in FIGS. 4 and 5 are assigned the same reference numerals, and will not be described again.

In S10a, the spectrum y and the coordinate array I are input, and then, in S30a, a predetermined value is assigned to ε. S12~S22, S32, and S34 are already described above. A computation formula shown in S38 is an updating formula of the weight array x, and is identical to Equation (10) described above.

According to the embodiment, because a large number of base functions can be prepared, a superior fitting result can be obtained even for a special baseline component. In addition, the problem of excessive fitting can be avoided. Further, in the related art, the appropriateness of the function selection and order designation by the user has significantly affected the fitting result. However, according to the above-described structure, a stable and superior fitting result can be obtained without imposing a significant burden on the user. The above-described structure is basically a method expanding the function fitting method of the related art, and, in this regard, the mechanism of fitting is intuitively and easily understood by the user. In the above-described embodiment, the NMR spectrum is processed, but alternatively, other spectra such as an X-ray spectrum, a mass spectrum, or the like may be processed.

The invention claimed is:

1. An apparatus for processing a spectrum to improve analysis precision of a waveform-of-interest component, comprising:
    a processor programmed or configured to:
        receive, from a measurement apparatus, a spectrum which includes a baseline component and the waveform-of-interest component;
        in response to receiving the spectrum, generate a baseline model by applying a weight array comprising a plurality of weights with respect to a base function array comprising a plurality of base functions;
        determine an optimum baseline model as an estimated baseline component according to:
            a first condition to fit the baseline model with respect to the baseline component; and
            a second condition to reduce an Lp norm (wherein p≤1) of the weight array; and
        based on the determined optimum baseline model, generate a second spectrum in which the baseline component from the spectrum is removed and/or reduced.

2. The apparatus for processing the spectrum according to claim 1, wherein
    the weight array becomes sparse when determining the optimum baseline model, and
    the optimum baseline model is formed by a part of the base function array.

3. The apparatus for processing the spectrum according to claim 1, wherein
    generating the second spectrum comprises subtracting the optimum baseline model from the spectrum.

4. The apparatus for processing the spectrum according to claim 1, wherein
    the first condition is a condition to fit a corresponding portion in the baseline model with respect to a representative portion in the baseline component.

5. The apparatus for processing the spectrum according to claim 1, wherein
    an evaluation value J is defined by an L2 norm of a residual determined from the baseline component and the baseline model, and an Lp norm of the baseline model, and
    a condition to minimize the evaluation value J forms the first condition and the second condition.

6. The apparatus for processing the spectrum according to claim 5, wherein
    a representative portion in the baseline component is selected from the spectrum, and
    the residual is a residual between the representative portion in the baseline component and a corresponding portion in the baseline model.

7. The apparatus for processing the spectrum according to claim 1, wherein
    the spectrum and the second spectrum are NMR spectra.

8. An apparatus for processing a spectrum to improve analysis precision of a waveform-of-interest component, comprising:
    a means for receiving a spectrum which includes a baseline component and the waveform-of-interest component from a measurement apparatus;
    a means for generating a baseline model in response to receiving the spectrum by applying a weight array comprising a plurality of weights with respect to a base function array comprising a plurality of base functions;

a means for determining an optimum baseline model as an estimated baseline component according to:
  a first condition to fit the baseline model with respect to the baseline component; and
  a second condition to reduce an Lp norm (wherein $p \leq 1$) of the weight array; and
a means for generating a second spectrum in which the baseline component from the spectrum is removed and/or reduced, wherein the second spectrum is generated based on the determined optimum baseline model.

9. A method of processing a spectrum to improve analysis precision of a waveform-of-interest component, comprising:
  receiving a spectrum which includes a baseline component and the waveform-of-interest component from a measurement apparatus;
  in response to receiving the spectrum, generating a baseline model by applying a weight array comprising a plurality of weights with respect to a base function array comprising a plurality of base functions;
  determining an optimum baseline model as an estimated baseline component according to:
    a first condition to fit the baseline model with respect to the baseline component; and
    a second condition to reduce an Lp norm (wherein $p \leq 1$) of the weight array; and
  based on the determined optimum baseline model, generating a second spectrum in which the baseline component from the spectrum is removed and/or reduced.

* * * * *